US011187772B2

(12) United States Patent
Chen

(10) Patent No.: US 11,187,772 B2
(45) Date of Patent: Nov. 30, 2021

(54) METHOD FOR CALIBRATING CURRENT MEASUREMENT DEVICE, CURRENT MEASUREMENT METHOD AND DEVICE, DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventor: Lei Chen, Beijing (CN)

(73) Assignees: HEFEI XINSHENG OPTOELECTRONICS, Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 249 days.

(21) Appl. No.: 16/318,569

(22) PCT Filed: May 24, 2017

(86) PCT No.: PCT/CN2017/085631
§ 371 (c)(1),
(2) Date: Jan. 17, 2019

(87) PCT Pub. No.: WO2018/014651
PCT Pub. Date: Jan. 25, 2018

(65) Prior Publication Data
US 2019/0285716 A1    Sep. 19, 2019

(30) Foreign Application Priority Data
Jul. 19, 2016    (CN) .......................... 201610567191.9

(51) Int. Cl.
*G01R 35/00*    (2006.01)
*G01R 19/00*    (2006.01)
(Continued)

(52) U.S. Cl.
CPC .......... *G01R 35/005* (2013.01); *G01R 19/00* (2013.01); *G01R 19/0023* (2013.01);
(Continued)

(58) Field of Classification Search
CPC ....... G09G 3/3208; G01R 19/00; G01R 35/00
See application file for complete search history.

(56) References Cited

U.S. PATENT DOCUMENTS 6,243,034 B1    6/2001 Regier
9,418,590 B2 *  8/2016 Park ..................... G09G 3/2092
(Continued)

FOREIGN PATENT DOCUMENTS

CN    1423807 A    6/2003
CN    1519796 A    8/2004
(Continued)

OTHER PUBLICATIONS

International Search Report from PCT Application No. PCT/CN2017/085631 dated Aug. 28, 2017 (5 pages).
(Continued)

*Primary Examiner* — Alvaro E Fortich
(74) *Attorney, Agent, or Firm* — Dave Law Group LLC; Raj S. Dave

(57) ABSTRACT

Embodiments of the disclosure provide a method for calibrating a current measurement device, a current measurement method and device, and a display device. The method for calibrating a current measurement device includes: inputting a plurality of given currents to the current measurement device; detecting a plurality of time parameters corresponding to the plurality of given currents; establishing the functional relationship between the current and the time parameter based on the plurality of given currents and the
(Continued)

corresponding plurality of time parameters. According to the embodiments of the disclosure, the precision of the current measurement is improved.

13 Claims, 5 Drawing Sheets

(51) Int. Cl.
G09G 3/22 (2006.01)
G09G 3/3208 (2016.01)
(52) U.S. Cl.
CPC ............... *G01R 35/00* (2013.01); *G09G 3/22* (2013.01); *G09G 3/3208* (2013.01)

(56) References Cited

U.S. PATENT DOCUMENTS

| | | | |
|---|---|---|---|
| 2004/0150590 | A1 | 8/2004 | Cok et al. |
| 2006/0044227 | A1* | 3/2006 | Hadcock ............ G09G 3/3225 345/76 |
| 2007/0063727 | A1* | 3/2007 | Miyake .................. G09G 3/006 324/762.09 |
| 2012/0229094 | A1 | 9/2012 | Shiramatsu |
| 2013/0235023 | A1 | 9/2013 | Chaji et al. |
| 2015/0061537 | A1 | 3/2015 | Kanda et al. |
| 2017/0069273 | A1* | 3/2017 | Park ..................... G09G 3/3233 |

FOREIGN PATENT DOCUMENTS

| | | |
|---|---|---|
| CN | 1777926 A | 5/2006 |
| CN | 1936603 A | 3/2007 |
| CN | 203414511 U | 1/2014 |
| CN | 103597534 A | 2/2014 |
| CN | 106093529 A | 11/2016 |
| JP | S5943627 A | 3/1984 |
| JP | 2002-148284 A | 5/2002 |
| JP | 2005-037286 A | 2/2005 |
| JP | 2006-133135 A | 5/2006 |
| JP | 2012-189490 A | 10/2012 |
| JP | 2013-205325 A | 10/2013 |
| JP | 2013-253841 A | 12/2013 |
| JP | 2013-253911 A | 12/2013 |
| JP | 2016-109660 A | 6/2016 |
| KR | 101530144 B1 | 6/2015 |
| WO | WO-0163587 A2 | 8/2001 |
| WO | WO-2004047058 A2 | 6/2004 |
| WO | WO-2012164474 A2 | 12/2012 |

OTHER PUBLICATIONS

Written Opinion from PCT Application No. PCT/CN2017/085631 dated Aug. 28, 2017 (5 pages).
Office Action from Chinese Application No. 201610567191.9 dated Jun. 4, 2018 (6 pages).
Office Action from Chinese Application No. 201610567191.9 dated Oct. 29, 2018 (7 pages).
Notice of Reasons for Refusal dated Apr. 5, 2021 for Japanese Patent Application No. 2017-567351, 6 pages.
Notice of Reasons for Refusal dated Oct. 4, 2021 for Japanese Patent Application No. 2017-567351, 4 pages.

* cited by examiner

METHOD FOR CALIBRATING CURRENT MEASUREMENT DEVICE, CURRENT MEASUREMENT METHOD AND DEVICE, DISPLAY DEVICE

CROSS-REFERENCE TO RELATED APPLICATION

This application claims the benefit and priority of Chinese Patent Application No. 201610567191.9, filed Jul. 19, 2016. The entire disclosure of the above application is incorporated herein by reference.

FIELD

Embodiments of the disclosure relate to display technologies, and more particularly to a method for calibrating a current measurement device, a current measurement method and device, and a display device.

BACKGROUND

In the field of display technology, organic light-emitting diode (OLED) has been widely used. In an array substrate of a display device, a driving transistor can generate a driving current based on a data voltage to drive an organic light-emitting diode to emit light for display. A threshold voltage of the driving transistor affects the correspondence relationship between the data voltage and the driving current. The threshold voltages of different driving transistors may be different and the threshold voltage of the same driving transistor may vary at different times. Therefore, it is not always possible to obtain the same driving current for the same data voltage, and the display device may emit light unevenly.

In order to make the display device to emit light evenly, it is necessary to detect the actual driving current and adjust the data voltage so that the actual driving current is equal to the set driving current. This requires high-precision detection of the actual driving current.

BRIEF DESCRIPTION

Embodiments of the disclosure provide a method for calibrating a current measurement device, a current measurement method and device, and a display device.

A first aspect of the embodiments of the disclosure provides a method for calibrating a current measurement device. The current measurement device is configured to measure a current based on a time parameter, which indicates a time required for the current to change a voltage in the current measurement device by a predetermined value. The method includes: inputting a plurality of given currents to the current measurement device; detecting a plurality of time parameters corresponding to the plurality of given currents; establishing the functional relationship between the current and the time parameter based on the plurality of given currents and the corresponding plurality of time parameters.

In embodiments of the disclosure, the functional relationship is a linear relationship.

In embodiments of the disclosure, the plurality of given currents are two given currents.

In embodiments of the disclosure, the plurality of given currents are more than two given currents.

A second aspect of the embodiments of the disclosure provides a current measurement method including: detecting a time parameter corresponding to a current; and determining the current, based on the time parameter corresponding to the current, and a functional relationship between the current and the time parameter. The functional relationship is calibrated using the method for calibrating the current measurement device as described above.

In embodiments of the disclosure, the functional relationship between the current and the time parameter is periodically calibrated.

In embodiments of the disclosure, the functional relationship is a linear relationship.

A third aspect of the embodiments of the disclosure provides a current measurement device including an operational amplifier and an integrating capacitor. The operational amplifier includes a positive input terminal, a negative input terminal and an output terminal. The integrating capacitor is connected between the negative input terminal and the output terminal. The negative input terminal is configured to be inputted with a current, and the positive input terminal is configured to be inputted with an initialization voltage. The current measurement device further includes: a control unit configured to detect a time parameter corresponding to the current, and determine the current based on the functional relationship between the current and the time parameter. The time parameter indicates a time required for the current to change a voltage at the output terminal by a predetermined value.

In embodiments of the disclosure, the current measurement device further includes a switching element connected between the negative input terminal and the output terminal. The switching element is configured to directly connect the negative input terminal and the output terminal before the current is inputted, so as to set voltages at the positive input terminal, the negative input terminal and the output terminal.

In embodiments of the disclosure, the current measurement device further includes: a current source configured to supply a plurality of given currents to the negative input terminal. The control unit is further configured to detect a plurality of time parameters corresponding to the plurality of given currents, and obtain the functional relationship between the current and the time parameter, based on the plurality of given currents and the corresponding plurality of time parameters.

A fourth aspect of the embodiments of the disclosure provides a display device including the current measurement device described above.

The method for calibrating a current measurement device, the current measurement method and device, and the display device, provided by the embodiments of the disclosure, improve the accuracy of current measurements.

BRIEF DESCRIPTION OF THE DRAWINGS

In order to more clearly illustrate the technical solutions of the embodiments of the disclosure, the drawings of the embodiments will be briefly described below, and it should be appreciated that the drawings described below relate to merely some of the embodiments of the disclosure rather than limit the disclosure, in which.

DETAILED DESCRIPTION

In order to make the technical solutions and advantages of the embodiments of the disclosure clearer, the technical solutions of the embodiments of the disclosure will be clearly and fully described below in conjunction with the accompanying drawings. It is obvious that the described embodiments are part, instead of all, of the embodiments of the disclosure. All other embodiments obtained by those skilled in the art based on the described embodiments of the disclosure without the need for creative work also fall within the scope of the disclosure.

Figure 1:
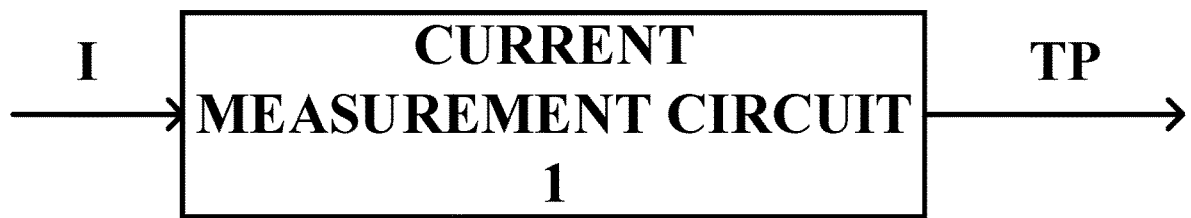
FIG. 1 is a schematic diagram of the principle of current measurement in embodiments of the disclosure.

FIG. 1 is a schematic diagram of the principle of current measurement in embodiments of the disclosure. As shown in FIG. 1, for the current I, it can be transformed into the corresponding time parameter TP using a current measurement circuit 1 to facilitate the measurement. This manner can be applied to the measurement of the driving current of a driving transistor in a display device.

The current measurement circuit 1 may be any circuit capable of transforming the current into the time parameter TP. The time parameter may indicate the time required for the current to change a voltage in the current measurement device by a predetermined value. For example, the current measurement circuit 1 may include an energy storage element such as a capacitor. The current I can charge the capacitor, and the time parameter can correspond to the charging time. The current I can also be used to discharge the capacitor, and the time parameter can correspond to the discharging time. The time parameter TP may directly be the value of the charging time or the discharging time and may also be obtained by transforming the value of the charging time or the discharging time.

Figure 2:
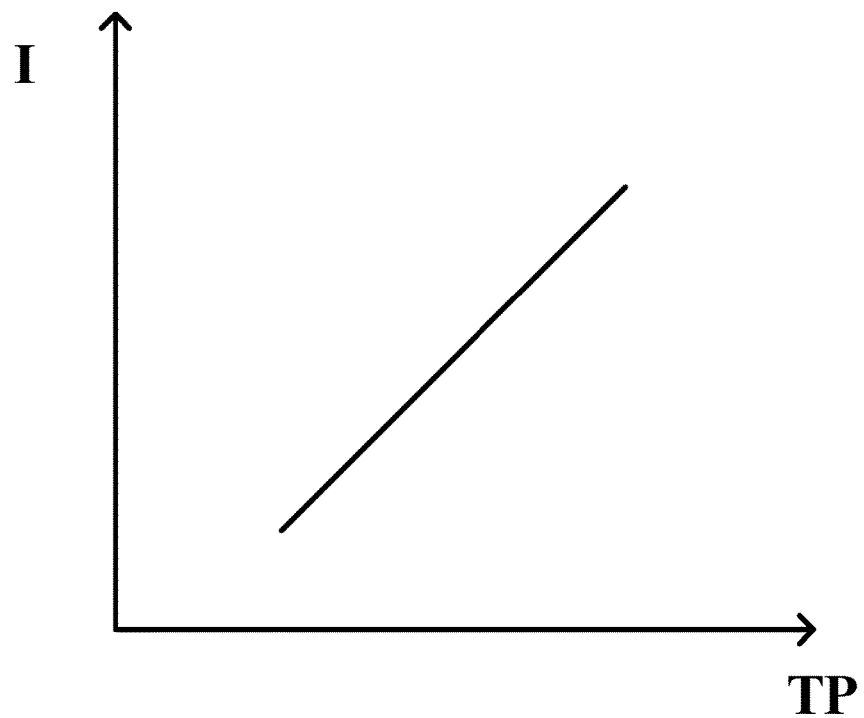
FIG. 2 is a schematic diagram of the functional relationship between the current and the time parameter shown in FIG. 1.

FIG. 2 is a schematic diagram of the functional relationship between the current and the time parameter shown in FIG. 1. As shown in FIG. 2, for the determined current measurement circuit 1, the current and the corresponding time parameter TP may have a one-to-one functional relationship therebetween, such as a linear relationship. The functional relationship can be calculated theoretically, and can also be obtained by a calibration. In the figure, the description is provided by taking a proportional relationship as an example, and it can be understood that the linear relationship may also be an inversely proportional relationship.

Figure 3:
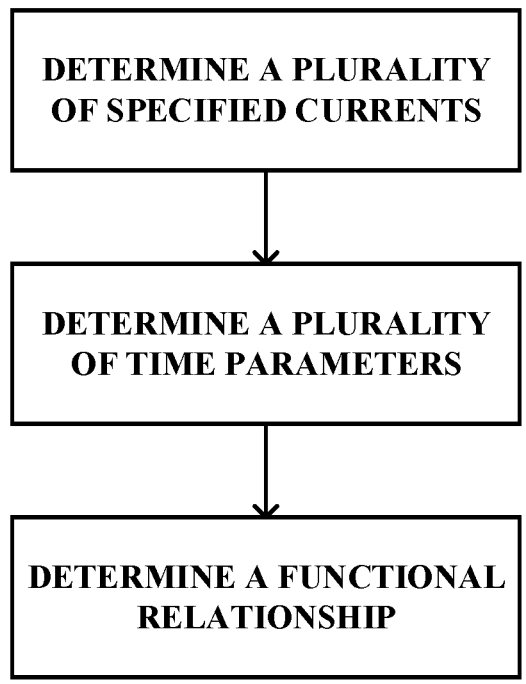
FIG. 3 is a flow diagram of a method for calibrating a current measurement device provided in embodiments of the disclosure.

FIG. 3 is a flow diagram of a method for calibrating a current measurement device provided in embodiments of the disclosure. As shown in FIG. 3, the method for calibrating the current measurement device includes: inputting a plurality of given currents to the current measurement device; detecting a plurality of time parameters corresponding to the plurality of given currents; establishing the functional relationship between the current and the time parameter based on the plurality of given currents and the corresponding plurality of time parameters.

The embodiments of the disclosure may be used to calibrate a current measurement device of an array substrate.

In embodiments of the disclosure, the functional relationship may be a linear relationship. In this case, only two coefficients are needed to illustrate the relationship. When two given currents and two corresponding time parameters are known, the two coefficients can be calculated. In addition, more than two currents and more than two corresponding time parameters can be used, and at this time, two coefficients illustrating the linear relationship are obtained by manners like fitting. The use of more than two currents can improve accuracy.

Figure 4:
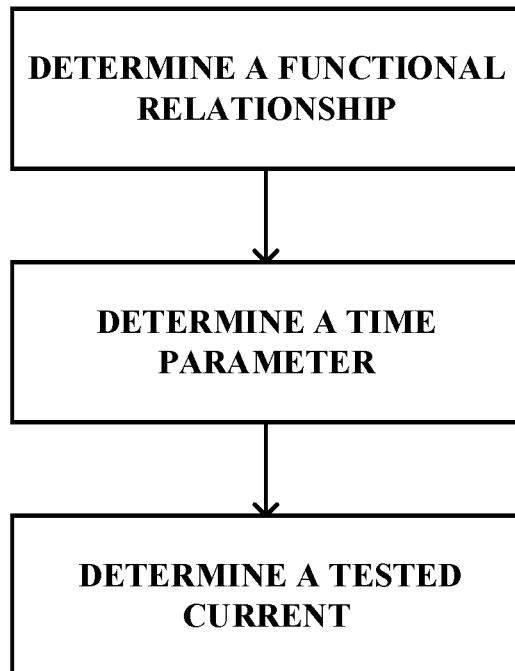
FIG. 4 is a flow chart of a current measurement method provided in embodiments of the disclosure.

FIG. 4 is a flow chart of a current measurement method provided in embodiments of the disclosure. As shown in FIG. 4, the current measurement method includes: determining a time parameter corresponding to a current; and determining the current, based on the time parameter corresponding to the current and the functional relationship between the current and the time parameter. The functional relationship can be a linear relationship.

The current measurement method may further include: calibrating the functional relationship between the current and the time parameter using the method for calibrating the current measurement device described above. Also, the calibration can be carried out periodically to maintain high accuracy.

The method for calibrating the current measurement device and the current measurement method provided by the embodiments of the present invention enable the more accurate measurement of the driving current of the driving transistor.

Hereinafter, the method for calibrating the current measurement device, the current measurement method and device provided in the embodiments of the present invention will be further described using a specific example circuit.

Figure 5:
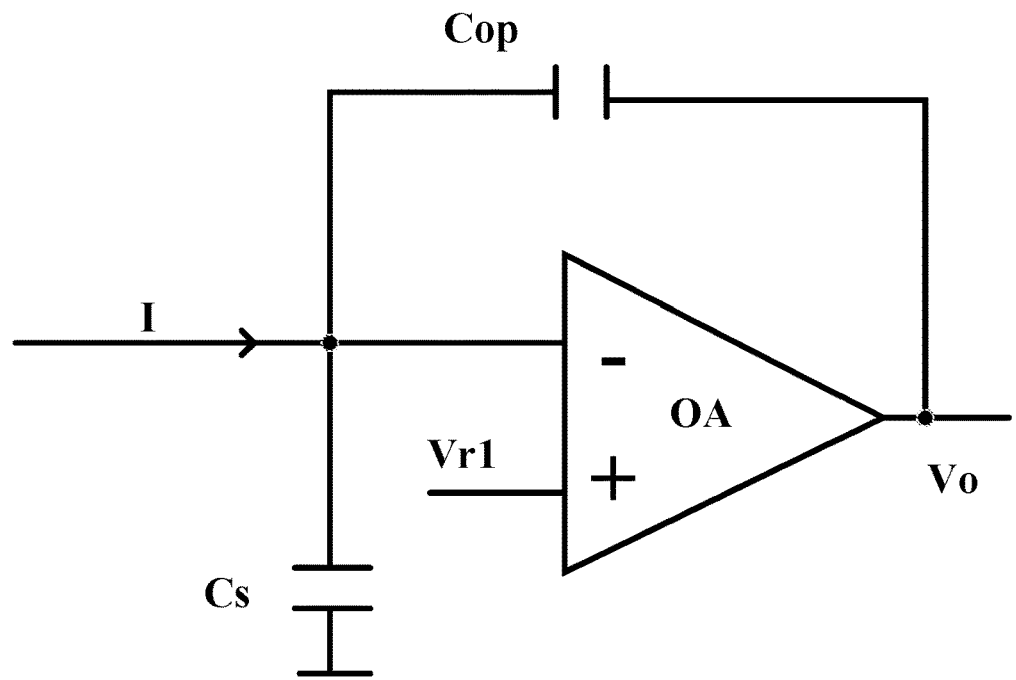
FIG. 5 is a schematic circuit diagram of a current measurement device provided in embodiments of the disclosure.

FIG. 5 is a schematic circuit diagram of a current measurement device provided in embodiments of the disclosure. As shown in FIG. 5, the current measurement device includes an operational amplifier OA, and an integrating capacitor Cop. The operational amplifier OA includes a positive input terminal, a negative input terminal and an output terminal. The integrating capacitor Cop is connected between the negative input terminal and the output terminal. The negative input terminal is configured to be inputted with a current I. The positive input terminal is configured to be inputted with an initialization voltage. In FIG. 5, the parasitic capacitance Cs is used to represent the influence of an external circuit of an array substrate.

As an example, the time parameter CT is used to represent the time required for the current I to change a voltage at the output terminal by a predetermined value. The time parameter CT is the discharging time of the integrating capacitor Cop, that is, the time required for a voltage Vo at the output terminal to decrease by a predetermined value $\Delta V$ when the current I is inputted to the negative input terminal.

The operational amplifier OA and the integrating capacitor Cop are used to transform the current I to the time parameter CT. The current measurement device may further include a control unit for calculating the current I according to the time parameter CT. Specifically, the control unit is configured to determine the time parameter corresponding to the current and to determine the current based on a preset functional relationship between the current and the time parameter.

In addition, in order to calibrate the preset functional relationship, the current measurement device may further include a current source configured to provide a plurality of given currents to the negative input terminal. The control unit is further configured to determine a plurality of time parameters corresponding to the plurality of given currents and to obtain the functional relationship between the current and the time parameter based on the plurality of given currents and the corresponding plurality of time parameters.

Figure 6:
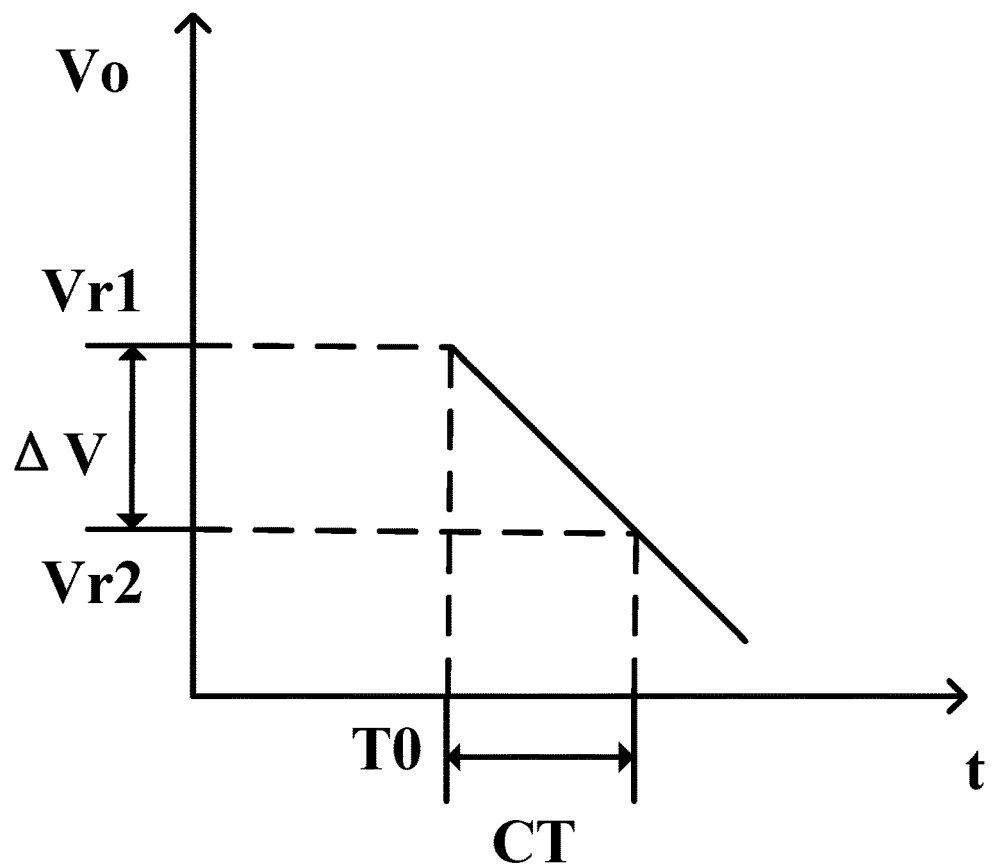
FIG. 6 is a schematic diagram of the time parameter associated with the current measurement device shown in FIG. 5.

FIG. 6 is a schematic diagram of the time parameter associated with the current measurement device shown in FIG. 5. When using the current measurement device shown in FIG. 5, the time parameter can be determined based on the following procedure. The voltages at the positive input terminal, the negative input terminal and the output terminal are set as the first reference voltage Vr1. The current I is inputted to the negative input terminal, and the current time is recorded as the discharge start time T0. The voltage Vo at the output terminal is detected until it is lowered to the second reference voltage Vr2 (the voltage difference therebetween is $\Delta V$), and the current time is recorded as the discharge end time. The difference between the discharge end time and the discharge start time is recorded, i.e., the discharging time CT.

The current measurement device may further include a switching element connected between the negative input terminal and the output terminal. The switching element is configured to directly connect the negative input terminal and the output terminal before the current is inputted, to set the voltages at the positive input terminal, the negative input terminal and the output terminal. The step of setting the voltages at the positive input terminal, the negative input terminal and the output terminal to the first reference voltage Vr1 includes directly connecting the negative input terminal and the output terminal through the switching element, and applying the first reference voltage Vr1 at the positive input terminal.

According to the embodiment of the present invention, the voltage setting and the discharge of the integrating capacitor Cop are performed by using the operational amplifier OA, which can improve the speed of the voltage setting, increase the stability of the discharging process, and improve the current measurement accuracy.

Figure 7:
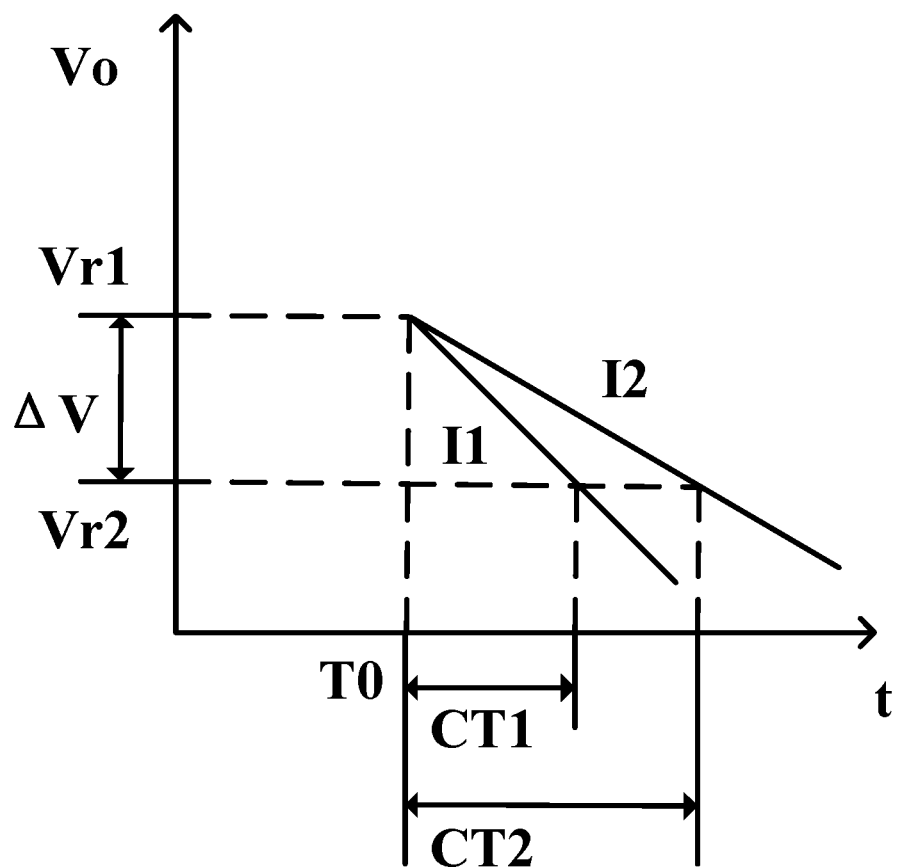
FIG. 7 is a schematic diagram of time parameters corresponding to different currents.

FIG. 7 is a schematic diagram of time parameters corresponding to different currents. As shown in FIG. 7, the first current I1 and the second current I2 correspond to the first discharging time CT1 and the second discharging time CT2, respectively.

Figure 8:
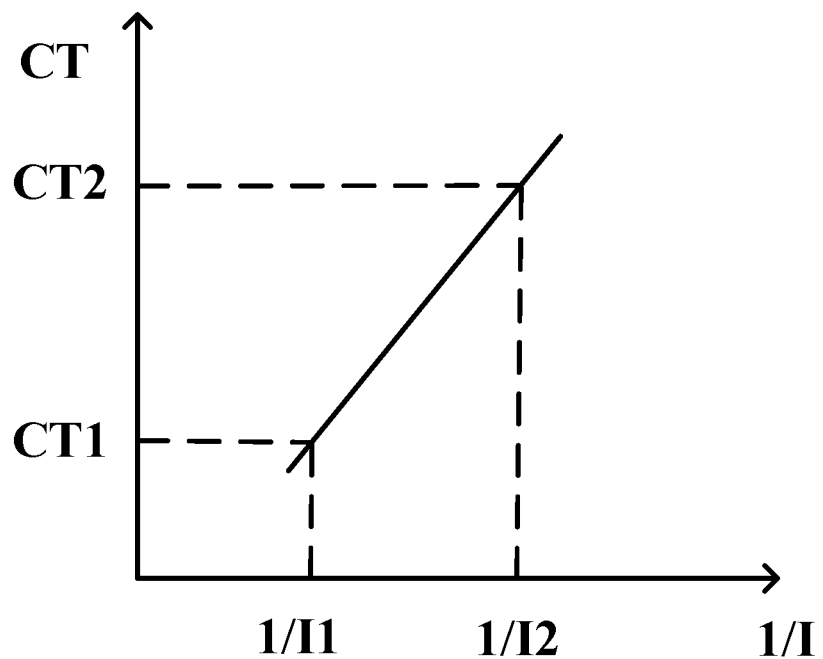
FIG. 8 is a schematic diagram of the functional relationship between the current and the time parameter associated with the current measurement device shown in FIG. 5.

FIG. 8 is a schematic diagram of the functional relationship between the current and the time parameter associated with the current measurement device shown in FIG. 5. As shown in FIG. 8, the functional relationship between the current I and the discharging time CT is obtained based on the first current I1, the second current I2, the first discharging time CT1, and the second discharging time CT2. The current I and the discharging time CT have an inversely proportional linear relationship therebetween, on the contrary, the reciprocal of the current I and the discharging time CT have a proportional linear relationship therebetween. The representation in FIG. 8 shows the process of calculating the current better: first measuring the discharging time CT, and then calculating the reciprocal of the current I, and finally calculating the current I.

Figure 9:
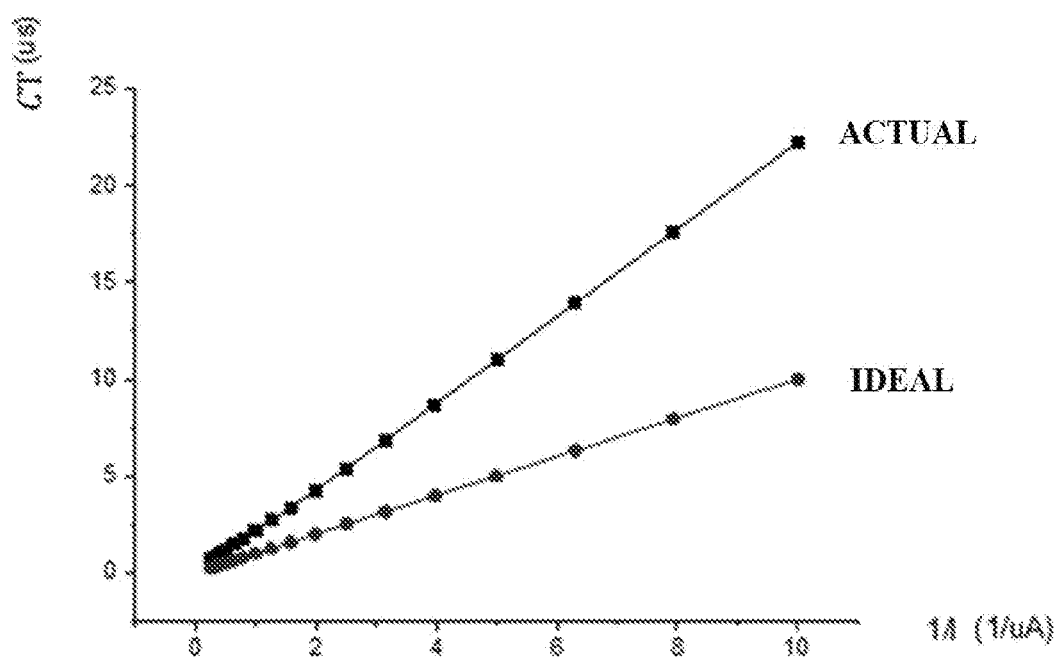
FIG. 9 is a schematic diagram of the functional relationship between the current and the time parameter associated with the current measurement device shown in FIG. 5 before and after a calibration.

FIG. 9 is a schematic diagram of the functional relationship between the current and the time parameter associated with the current measurement device shown in FIG. 5 before and after calibration. As shown in FIG. 9, the ideal functional relationship is obtained directly based on the circuit structure, i.e.: $I=Cop*\Delta V/CT$. Without consideration of the interference from the external circuit and the error in the manufacturing process of the integrating capacitor Cop, the ideal functional relationship and the actual functional relationship obtained by calibration are quite different.

The actual functional relationship obtained by calibration can be expressed as follows: $I=C\_eff*\Delta V/(CT-CT0)$, wherein the curve slope C_eff is the equivalent capacitance and the curve intercept CT0 is the discharging time calibration coefficient. After obtaining the curve slope C_eff and the curve intercept CT0 by calibration, the current I can be directly calculated based on any discharging time CT during current measurement.

The method for calibrating a current measurement device, the current measurement and the current measurement device according to the embodiments of the present invention enable the more accurate measurement of the driving current of the driving transistor.

Further provided in the embodiments of the disclosure is a display device including the current measurement device described above.

It is to be understood that the above embodiments are merely exemplary embodiments for the purpose of illustrating the principles of the disclosure, however, the disclosure is not limited thereto. It will be apparent to those of ordinary skill in the art that various modifications and improvements can be made without departing from the spirit and essence of the disclosure, which are also considered to be within the scope of the disclosure.

What is claimed is:

1. A method for calibrating a current measurement device, comprising: inputting a plurality of given currents to the current measurement device; detecting a plurality of time parameters corresponding to the plurality of given currents; and establishing a functional relationship between a current and a time parameter based on the plurality of given currents and the corresponding plurality of time parameters;
    wherein the current measurement device is configured to measure the current based on the time parameter, and the time parameter indicates a time required for the current to change a voltage in the current measurement device by a predetermined value;
    wherein the current measurement device comprises an operational amplifier and an integrating capacitor; wherein the operational amplifier comprises a positive input terminal, a negative input terminal and an output terminal; wherein the integrating capacitor is connected between the negative input terminal and the output terminal; wherein the negative input terminal is configured to be inputted with the current, and the positive input terminal is configured to be inputted with an initialization voltage; wherein the current measurement device further comprises a control unit configured to detect the time parameter corresponding to the current, and determine the current based on the functional relationship between the current and the time parameter; and wherein the time parameter indicates the time required for the current to change the voltage at the output terminal by the predetermined value.

2. The method for calibrating a current measurement device according to claim 1, wherein the functional relationship is a linear relationship.

3. The method for calibrating a current measurement device according to claim 1, wherein the plurality of given currents are two given currents.

4. The method for calibrating a current measurement device according to claim 1, wherein the plurality of given currents are more than two given currents.

5. A current measurement method comprising: detecting a time parameter corresponding to a current; and determining the current, based on the time parameter corresponding to the current, and a functional relationship between the current and the time parameter; wherein the functional relationship is calibrated using the method for calibrating a current measurement device according to claim 1.

6. The current measurement method according to claim 5, wherein the functional relationship between the current and the time parameter is periodically calibrated.

7. The current measurement method according to claim 5, wherein the functional relationship is a linear relationship.

8. A current measurement device comprising an operational amplifier and an integrating capacitor; wherein the operational amplifier comprises a positive input terminal, a negative input terminal and an output terminal; wherein the integrating capacitor is connected between the negative input terminal and the output terminal; wherein the negative input terminal is configured to be inputted with a current, and the positive input terminal is configured to be inputted with an initialization voltage; wherein the current measurement device further comprises a control unit configured to detect a time parameter corresponding to the current, and determine the current based on a functional relationship between the current and the time parameter; and wherein the time parameter indicates a time required for the current to change a voltage at the output terminal by a predetermined value.

9. The current measurement device according to claim 8, further comprising a switching element connected between the negative input terminal and the output terminal; wherein the switching element is configured to directly connect the negative input terminal and the output terminal before the current is inputted, so as to set voltages at the positive input terminal, the negative input terminal and the output terminal.

10. The current measurement device according to claim 8, further comprising: a current source configured to supply a plurality of given currents to the negative input terminal; wherein the control unit is further configured to detect a plurality of time parameters corresponding to the plurality of given currents, and obtain the functional relationship between the current and the time parameter based on the plurality of given currents and the corresponding plurality of time parameters.

11. A display device comprising the current measurement device according to claim 8.

12. The display device according to claim 11, wherein the current measurement device further comprises a switching element connected between the negative input terminal and the output terminal; and wherein the switching element is configured to directly connect the negative input terminal and the output terminal before the current is inputted, so as to set voltages at the positive input terminal, the negative input terminal and the output terminal.

13. The display device according to claim 11, wherein the current measurement device further comprises a current source configured to supply a plurality of given currents to the negative input terminal; and wherein the control unit is further configured to detect a plurality of time parameters corresponding to the plurality of given currents, and obtain the functional relationship between the current and the time parameter based on the plurality of given currents and the corresponding plurality of time parameters.

* * * * *